(12) United States Patent
Hubble, III et al.

(10) Patent No.: US 6,320,182 B1
(45) Date of Patent: Nov. 20, 2001

(54) LIGHT COLLECTOR FOR AN LED ARRAY

(75) Inventors: Fred F. Hubble, III, Monroe; Mark A. Scheuer, Wayne; Nicholas M. Soures, Monroe; G. Peter Floridio, Fairport; Moritz P. Wagner, Wayne; Steven L. Aurand, Monroe, all of NY (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/451,410

(22) Filed: Nov. 30, 1999

(51) Int. Cl.[7] ................................................. G02B 27/10
(52) U.S. Cl. ......................... 250/216; 359/627; 362/327
(58) Field of Search ............................ 250/216; 359/627, 359/708, 709, 710, 718, 719, 726–729, 808, 811; 362/327, 335

(56) References Cited

U.S. PATENT DOCUMENTS

| | | | |
|---|---|---|---|
| 1,977,689 | * 10/1934 | Muller | 359/728 |
| 2,224,178 | * 12/1940 | Bitner | 362/337 |
| 2,254,961 | * 9/1941 | Harris et al. | 362/327 |
| 2,254,962 | * 9/1941 | Harris et al. | 362/327 |
| 4,767,172 | * 8/1988 | Nichols et al. | 385/146 |
| 5,526,190 | 6/1996 | Hubble . | |
| 5,757,557 | * 5/1998 | Medvedev et al. | 359/708 |
| 5,973,853 | * 10/1999 | Gaebe et al. | 359/668 |
| 6,115,184 | * 9/2000 | Hubble, III et al. | 359/627 |

* cited by examiner

Primary Examiner—Stephone B. Allen
(74) Attorney, Agent, or Firm—Fay, Sharpe, Fagan, Minnich & McKee, LLP

(57) ABSTRACT

A light collector for directing light to a concentrated area on a target surface such as for use with a linear LED array used as an erase lamp in an electrophotographic printer. The collector includes a compound cylinder lens supported by a pair of reflecting members. The reflecting members reflect light rays from the LED array to the cylinder lens. The cylinder lens includes a lower surface for capturing the reflected light rays and a tongue extending from the lower surface for capturing light rays directly from the LED array. The cylinder lens directs and concentrates the captured light rays in a narrow line on a target surface. A plurality of cross-ribs extend between the first and second reflecting members to specularly reflect light beams from the LED array.

20 Claims, 7 Drawing Sheets

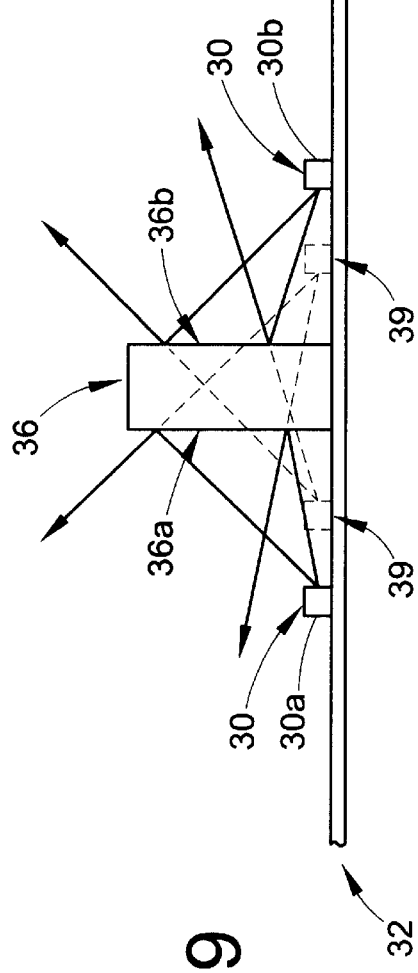
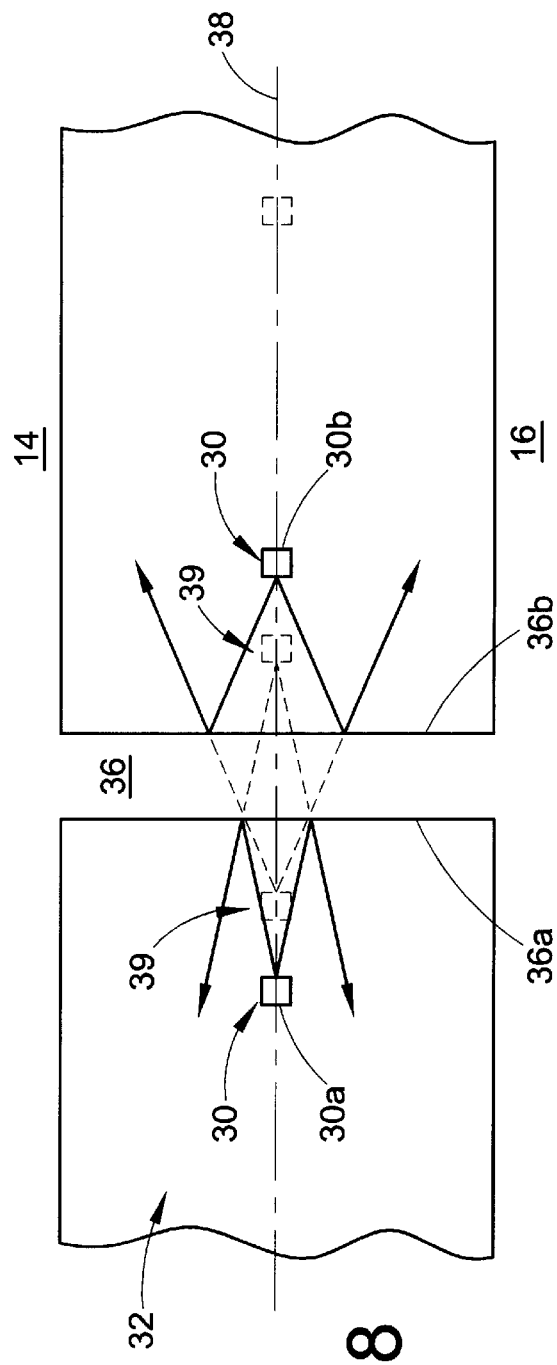
FIG. 9
FIG. 8

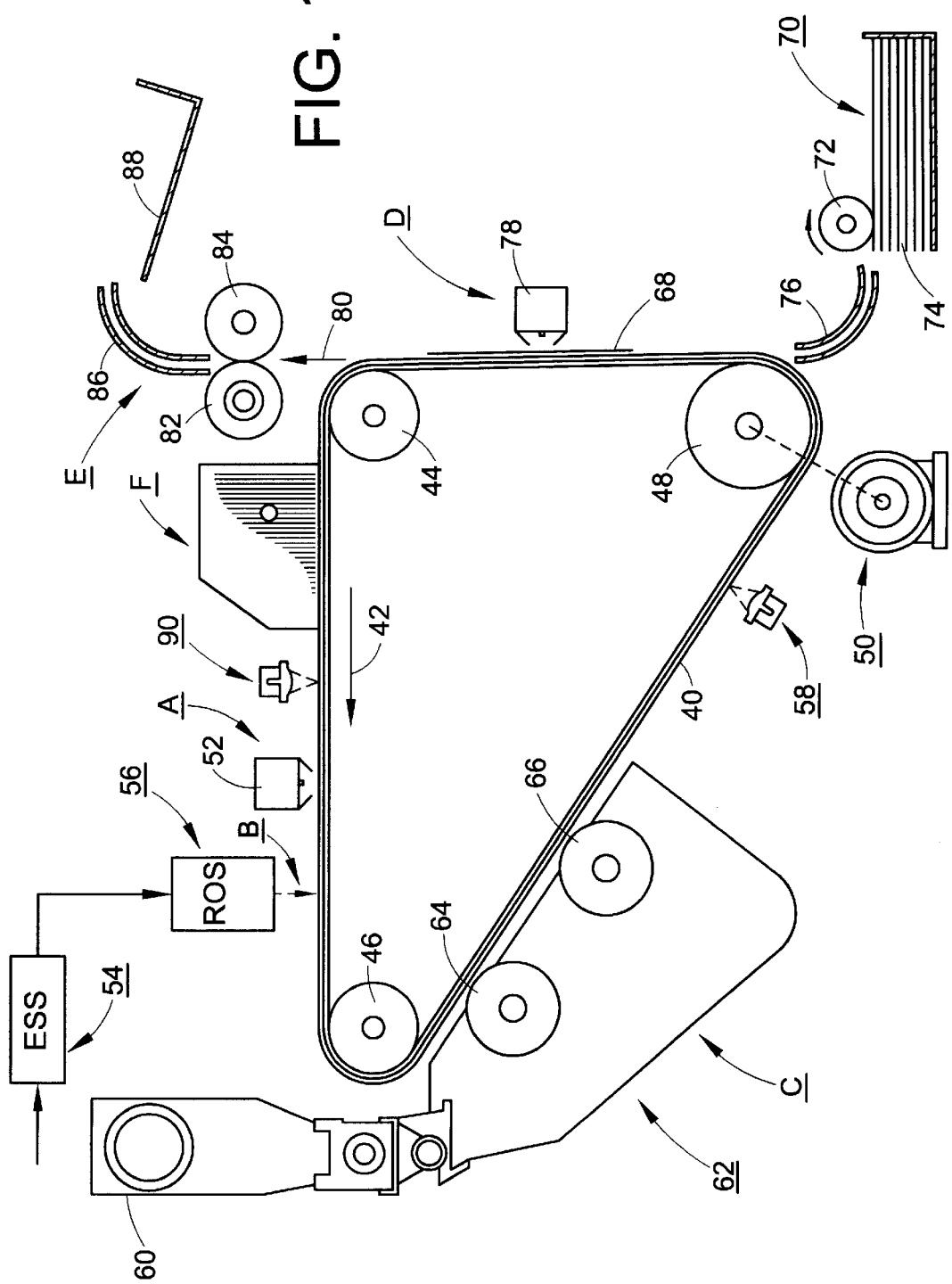

LIGHT COLLECTOR FOR AN LED ARRAY

BACKGROUND OF THE INVENTION (1) Field of the Invention

The present invention relates to a light collector for directing light to a concentrated area on a target surface and, in particular, to a linear light collector for an LED array used in an erase lamp in an electrophotographic printer.

(2) Description of the Related Art

In electrophotographic printing, a charge-retentive, photosensitive surface, known as a photoreceptor, is initially charged uniformly. In an exposure step, light either from an original image focused on the photoreceptor or created by the action of digital image data modulating a scanning laser selectably discharges specific areas of the surface to create a latent image. In a development step, toner particles are applied to the latent image. The toner particles adhere only to those areas on the photoreceptor on which an electrostatic charge remains. This developed image on the photoreceptor is then transferred to a print sheet on which the desired print or copy is fixed. After the developed image has been transferred, the photoreceptor is cleaned to remove any toner particles and paper fibers that may adhere to the belt.

In printing process outlined above there are various times, in addition to the exposure step, where it is desirable to discharge the photoreceptor. For example, prior to the transfer step, the photoreceptor is often discharged to reduce the holding charge on the toner and to improve the transfer efficiency. Similarly, during the cleaning step it is desirable to remove any and all residual charge on the photoreceptor prior to the next cycle.

One common method of reducing or removing the charge from the photoreceptor is to expose the photoreceptor to light. In xerographic equipment, what is commonly known as an "erase lamp" or "erase bar" is used to generate a small, well-defined band of light to discharge portions of the photoreceptor. An ideal erase lamp would be capable of selectably discharging the photoreceptor without generating stray light that may interfere with the operation of other portions of the printer. That is, as the performance of many of the elements of a xerographic printer, e.g., corotrons, optical sensors and imagers, are degraded in the presence of stray light, an ideal erase lamp would be efficient and direct substantially all of this light against the photoreceptor in a narrow band, with no unwanted stray light that may illuminate the above-mentioned elements.

A preferred light source for use in erase lamps is a light-emitting diode, or LED. When lit, an LED creates light that emanates from an area that is generally small when compared to the dimensions of the optic elements of a typical lamp and thus creates a near point-source form. A collector is often used to take the light from a line of LEDs and direct the beams therefrom so that the beams appear to be emanating from a single linear light source.

Many devices have been designed for directing light from an array of LEDs to a small linear area on a target surface. U.S. Pat. No. 4,767,172 discloses a collector for an LED array wherein each LED within the array is provided with a linear collector, including a central convex lens portion and an outer parabolic reflecting surface. Light exiting substantially perpendicular to the substrate on which the LED is mounted is applied to the convex lens and collimated, while light exiting substantially parallel to the substrate on which the LED is mounted strikes a parabolic reflecting surface, and is also collimated, resulting in two concentric collimated beams which are directed onto a target surface.

U.S. Pat. No. 5,526,190 discloses an optical element adapted to be interposed between an array of light sources and a target surface. A central cylinder lens collimates light beams from the light source and directs the collimated light beams to a preselected area on the target surface. First and second outer reflective portions, each attached to and extending parallel to the cylinder lens, totally internally reflect light beams from the light source and direct the light beams reflected therein to the target surface.

The above-described devices collect light from an array of LEDs and direct the light to a small linear area on a target surface. However, one drawback associated with the devices described above arises from their shape. In both of the devices the central lens portion is lower in profile than the outer reflecting portion thereby creating a deep cavity or pocket over the central lens portion. These pockets tend to collect optical contaminants such as toner particles and paper fibers increasing the difficulty of the periodic cleaning required for all erase lamps.

SUMMARY OF THE INVENTION

According to one aspect of the present invention, there is provided a light collector adapted to be interposed between a light source and a target surface. The light collector includes a cylinder lens having an upper surface and a lower surface with a tongue extending therefrom. The cylinder lens is supported by a pair of reflecting members that reflect light beams from the light source and direct the reflected light beams to the lower surface of the cylindrical lens. A number of cross-ribs extend between the reflecting members to specularly reflect light beams from said light source.

According to a second aspect of the present invention, there is provided an apparatus for irradiating a target surface, comprising a plurality of light sources arranged in linear array, first and second reflecting members adapted to reflect light beams from the light sources and direct the reflected light beams in a uniform direction, and a cylinder lens supported by the reflecting members. The cylinder lens includes an upper surface and a lower surface with a tongue extending therefrom. The cylinder lens is adapted to receive the reflected light beams at the lower surface and direct the light beams to a preselected area on the target surface. A number of cross-ribs extend between the reflecting members to specularly reflect light beams from said light source.

One advantage of the present invention is the provision of a light collector adapted to be interposed between a light source and a target surface, which light collector includes a plurality of cross-ribs that fix the position of first and second reflecting members relative to each other to maintain the light collector profile along the length of the collector without affecting the optical collecting properties of the collector.

Another advantage of the present invention is the provision of a light collector adapted to be interposed between a light source and a target surface, which light collector includes a plurality of cross-ribs that mechanically stabilize two reflecting members to facilitate the coating and/or assembly of the light collector to a substrate during manufacture.

Further advantages of the present invention will become apparent to those of ordinary skill in the art upon reading and understanding the following detailed description of the preferred embodiments.

BRIEF DESCRIPTION OF THE DRAWINGS

A more complete understanding of the invention and many of the attendant advantages thereto will be readily appreciated as the same becomes better understood by reference to the following detailed description when considered in conjunction with the accompanying drawings wherein like reference numerals and symbols designate identical or corresponding parts throughout the several views and wherein:

FIG. 8 is an enlarged, partial, top plan view of a linear array of light sources of the light collector of FIG. 5;

FIG. 9 is a side elevational view of the linear array of light sources of FIG. 9; and FIG. 10 is a schematic diagram of an electrophotographic printing machine which may incorporate the present invention therein.

DETAILED DESCRIPTION OF THE INVENTION

Figure 1:
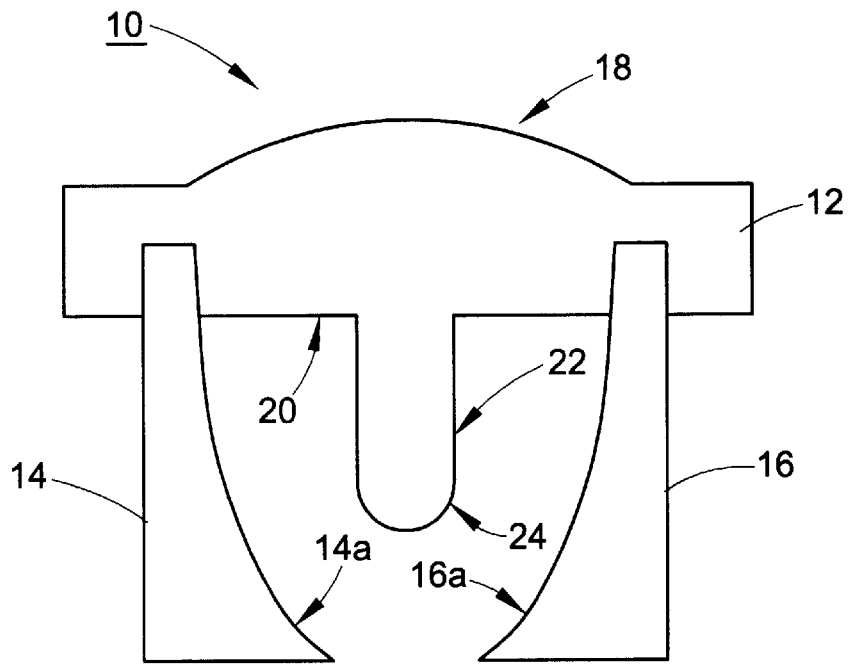
FIG. 1 is an end, elevational view of a light collector according to the present invention.

Referring to FIG. 1, there is shown an end view of a light collector 10 in accordance with the present invention. It will be apparent that the profile of light collector 10 shown in FIG. 1 is intended to be constant throughout the effective length of the collector. Light collector 10 comprises a cylinder lens 12 supported by first and second reflecting members 14 and 16 that combine to form a cylindrical reflector.

As used herein the term "cylinder lens" shall mean any optical element extending in a direction and having a substantially constant lens profile throughout the length thereof. Similarly, the term "cylindrical reflector" or "cylinder mirror" shall mean any optical element extending in a direction and having a substantially constant reflective surface profile throughout the length thereof. As can be seen from FIG. 1, neither the cylinder lens nor the cylindrical reflector need be in the form of a cylinder or a portion of a cylinder.

Cylinder lens 12 is preferably made of glass or any appropriate transparent plastic material such as styrene, acrylic or polycarbonate and comprises a partially convex upper surface 18 and a planer lower surface 20 having a tongue 22 extending therefrom. Tongue 22 has a convex surface 24 at the distal end and operates preferentially as a hyperbolic cylinder lens. Light striking surface 24 is refracted and thereby collimated to be substantially parallel and directed through the tongue toward upper surface 18.

Figure 1A:
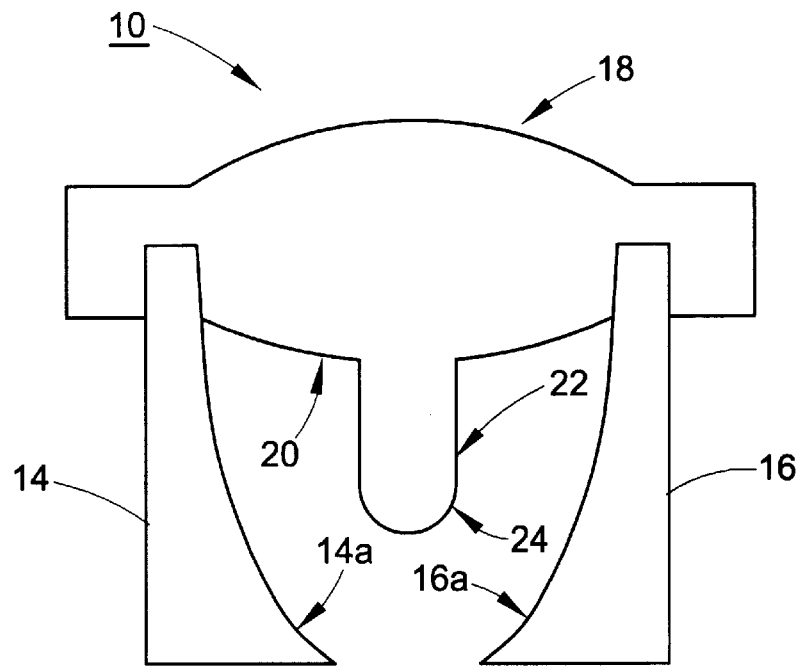
FIG. 1a is an end, elevational view of a light collector having an alternate lens design according to the present invention.

In a preferred embodiment, from the standpoint of optical performance, the upper surface 18 is convex over at least the portion of cylinder lens 12 covering the cylindrical reflector thereby forming a plano hyperbolic cylinder lens that refracts and concentrates light exiting therefrom in a narrow line on a target surface. However, from the standpoint of efficient and accurate injection molding, the upper surface 18 can be planer over its entire extent, and the lower surface 20 can be convex, as shown in FIG. 1a. The particular shape of cylinder lens 12 shown in FIG. 1 is specifically designed for light-transmissive materials having a refraction index of approximately 1.5 and for the transmission of light of a wavelength between about 660 to 770 nm. It should be apparent to those skilled in the art that the specific shapes of the surfaces will have to be adapted slightly for materials of different refraction indices and for different expected light sources.

Reflecting members 14 and 16 preferably are fabricated from an easily molded material and include reflective surfaces 14a and 16a, respectively, that are coated with a reflective material such as nickel, aluminum, gold, chromium or the like. In a preferred embodiment, reflective surfaces 14a and 16a are parabolic in shape and are positioned such they combine to form a cylinder mirror having a parabolic cross-section. By positioning the reflective surfaces 14a and 16a in this manner, light rays from a source located at the focus of the parabolic mirror that strike surfaces 14a and 16a will be reflected to be substantially parallel to each other and be directed toward lower surface 20 of lens 12.

Figure 2:
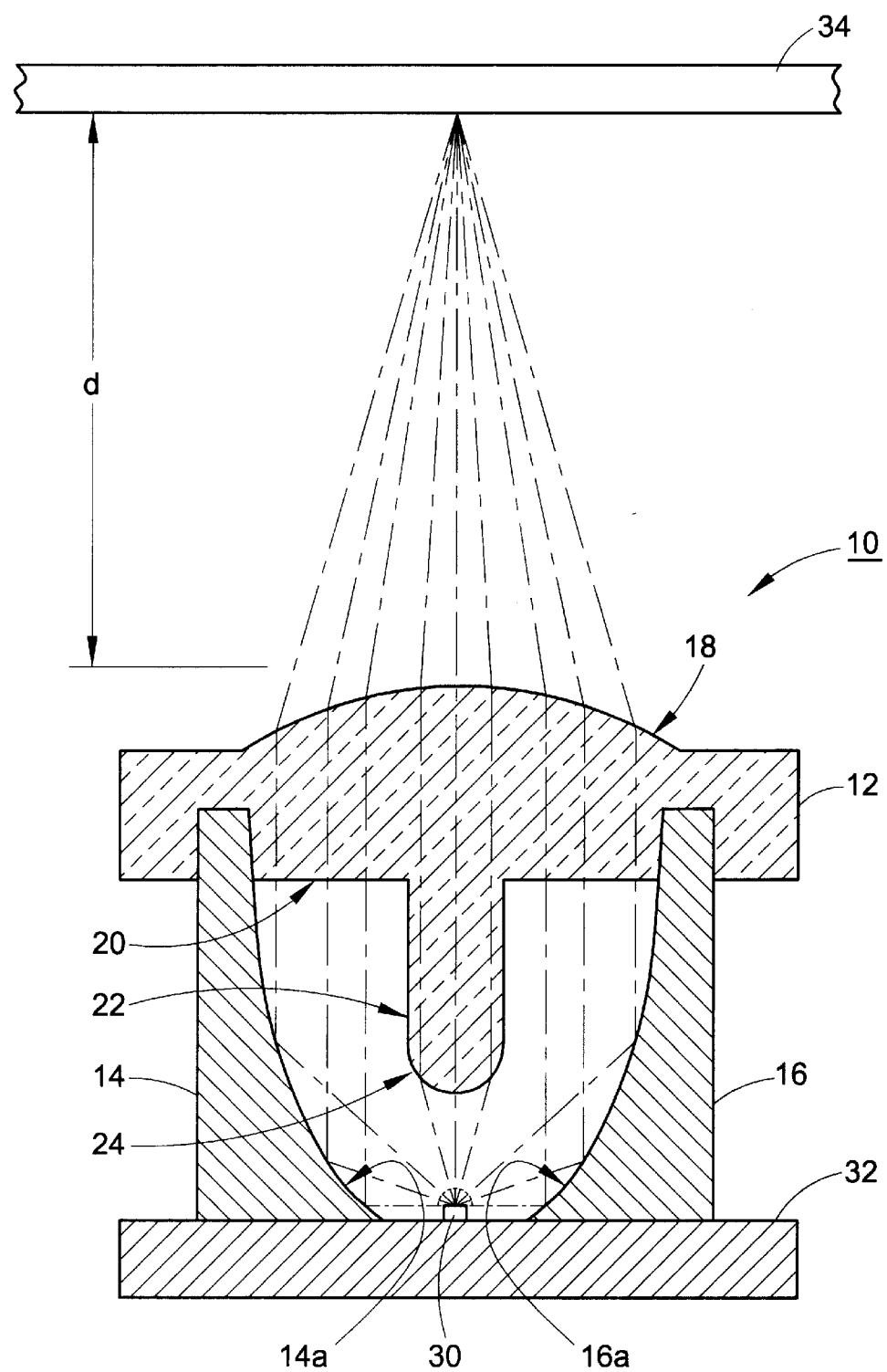
FIG. 2 is a sectional, elevational view of a light collector showing the behavior of selected rays emitted from a source interacting with the collector.

The interaction of light rays with reflective surfaces 14a and 16a and cylinder lens 12 of light collector 10 is described with reference to FIG. 2. In FIG. 2 there is provided a cross-sectional view of light collector 10 showing the behavior of selected light rays emitted from a source 30, such as an LED die mounted on a substrate 32, as they propagate through the collector. Light collector 10 is mounted to substrate 32 such that source 30 is located at the focus of the parabolic cylinder mirror formed by reflective surfaces 14a and 16a.

As a practical embodiment of an erase lamp using the light collector of the present invention, a linear array of LEDs 30 are mounted on a flat surface such as substrate 32. Each of the LEDs 30 of the linear array emits light almost as a point source, with rays being emitted essentially in all directions therefrom. The rays emitted from the LEDs 30 are captured by collector 10 and directed to a target surface 34, which may be, for example, a photoreceptor in an electrophotographic printer. In addition to collecting light, it will be appreciated that collector 10 encloses the array and, thus, protects it from handling and the ingress of optical contamination such as toner particles.

In operation LED 30 acts as a point source emitting light in all directions. LED flux emitted from between approximately 0° (parallel to substrate 32) and 50° above the substrate strike one of the reflective surfaces 14a or 16a and is collimated (reflected to be substantially parallel) and directed upward towards cylinder lens 12. The reflected flux, which is essentially perpendicular to surface 20, enters lens 12 without being refracted. On exiting at surface 18 of lens 12, the flux is refracted and concentrated at surface 34 in a narrow linear irradiation pattern.

LED flux that is emitted between approximately 50° and 90° above substrate 32 strikes the hyperbolic lens at the distal end of tongue 22. This captured flux enters lens 12 at the convex surface 24 and is refracted with the effect being that the flux is collimated or redirected to be substantially parallel. The flux travels through tongue 22 and exits cylinder lens 12 at surface 18 where this collimated flux is refracted and concentrated at surface 34 in a narrow line coincident with the narrow line irradiation pattern produced by the flux reflected by the parabolic reflecting surfaces 14a and 16a after passing through cylinder lens 12.

As described above, the cylinder lens 12 and reflective surfaces 14a and 16a are so sized and positioned relative to each other and to each LED 30 that the flux emitted between 90° and about 50° relative to substrate 32 are captured by the hyperbolic lens at surface 24, while the beams emitted from LED 30 between 50° and 0° relative to substrate 32 will be reflected into lower surface 20 of cylinder lens 12 by one of the reflective surfaces 14a or 16a. In this way, a relatively high proportion of all the flux emitted from an LED 30 will ultimately be concentrated to a single narrow line at surface 34. It is understood that the division of light along the 0° to 90° intensity profile of the particular LED between the hyperbolic lens 24 and reflective surfaces 14a and 16a need not be at the 50° angle for all cases, but could exist around other angles, such as 45° or 55°, depending on a specific design or the intensity profile of a particular type of LED.

It should be appreciated that the shape of cylinder lens 12 can be varied to meet particular requirements. For example, the distance d between surface 18 of cylinder lens 12 and surface 34 can be fitted to a desired distance by varying the shape of surface 18 in a known manner. Similarly, the position of the irradiation pattern on surface 34 can be shifted in to one side by altering the shape of surface 18 in a known manner.

Figure 3:
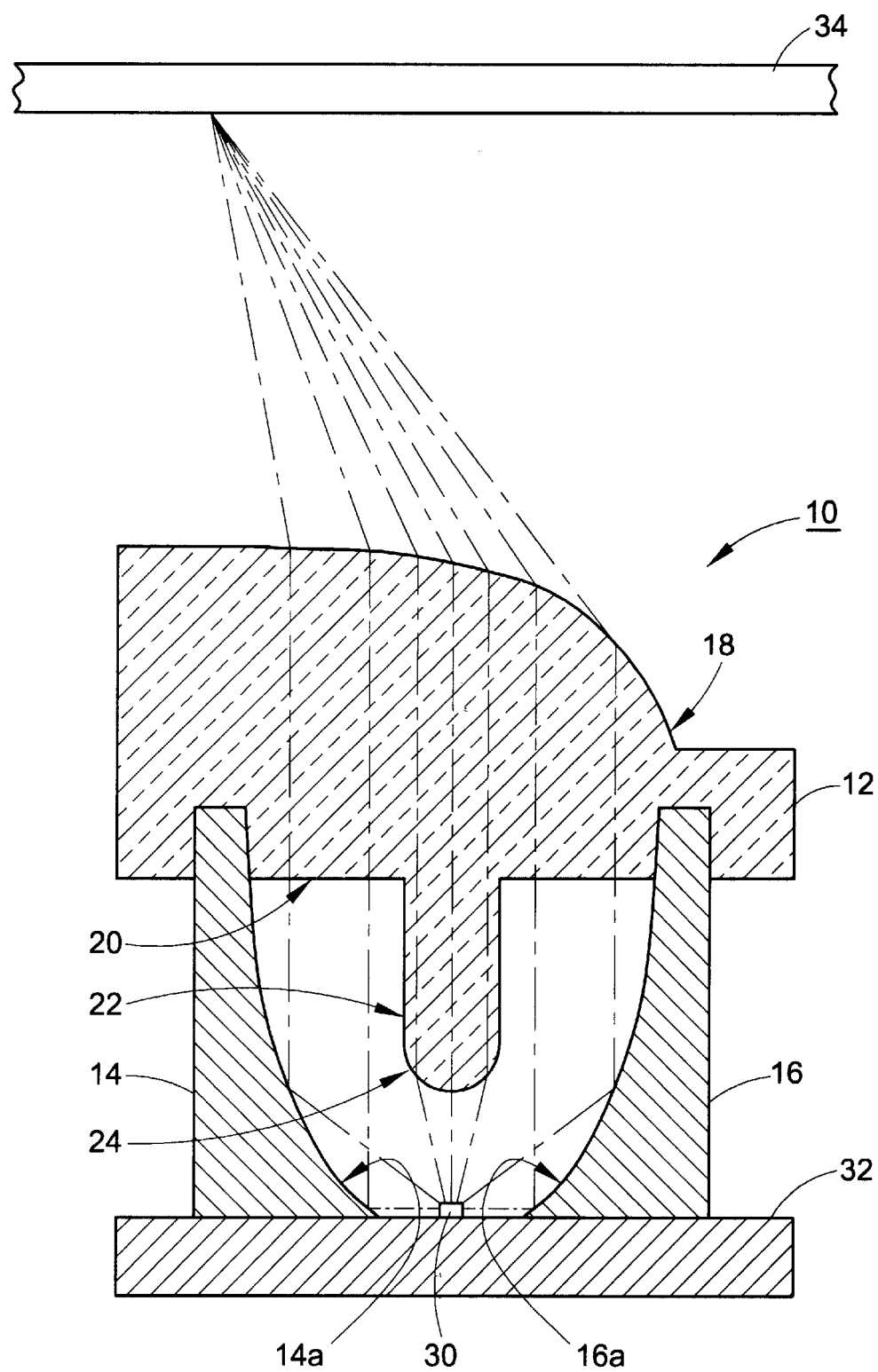
FIG. 3 is a sectional, elevational view of a second embodiment of a light collector showing the behavior of selected light rays as they propagate through the collector.

Referring now to FIG. 3 there is shown a light collector 10 with a cylinder lens 12 that "shifts" the concentration point of the narrow line irradiation pattern in a desired direction. The collector of FIG. 3 operates in a similar manner to that of the collector of FIG. 2. That is, flux emitted from between 90° and about 50° above substrate 32 is captured by the hyperbolic lens at surface 24, while the flux emitted from between 50° and 0° relative to substrate 32 will be reflected into lower surface 20 of cylinder lens 12 by one of the reflective surfaces 14a or 16a. The flux exits cylinder lens 12 at surface 18 where the flux is refracted and concentrated at surface 34 in a narrow line irradiation pattern that is "shifted" to the left of LED 30. The design shown in FIG. 3 has the advantage in that an erase lamp can be positioned to direct light in a direction away from components that are degraded in the presence of stray light such as optical sensors and imagers and towards components such as a preclean dicorotron where the effect of stray light is beneficial.

Figure 4:
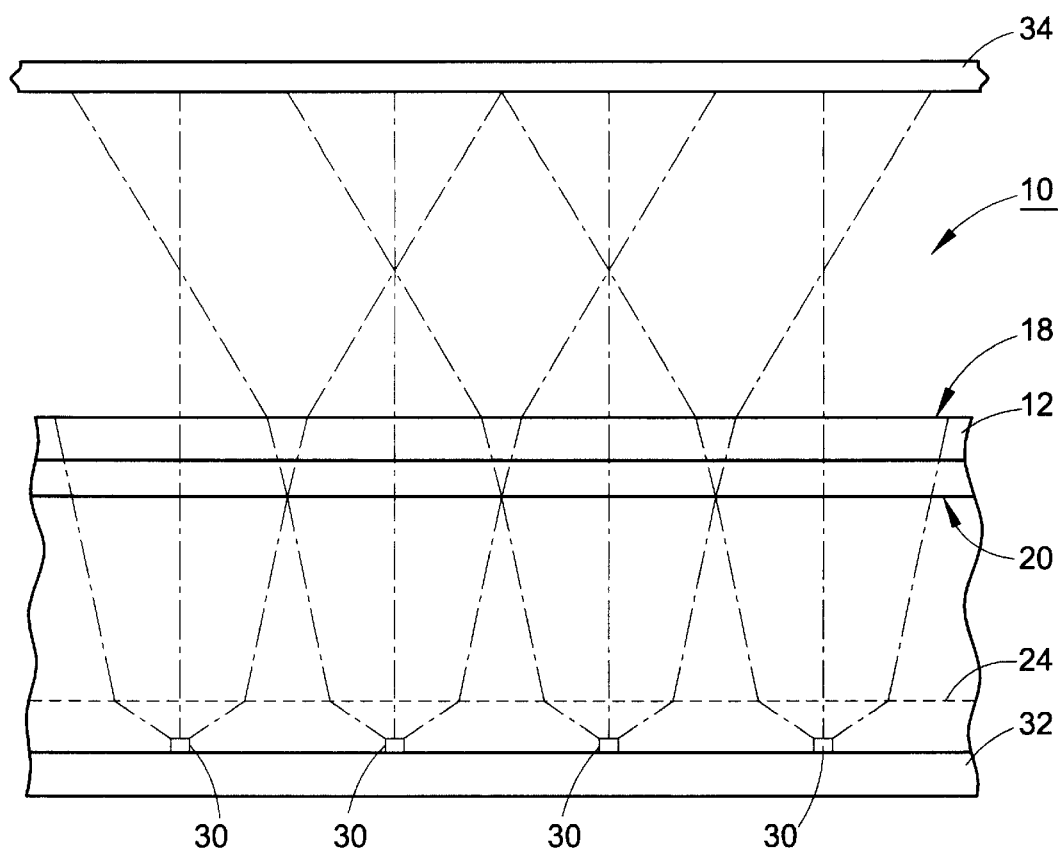
FIG. 4 is an elevational view along a length of a light collector showing the interaction of selected light rays emitted from a series of point sources as the light rays propagate through the collector.

Referring now to FIG. 4, there is shown a side view, orthogonal to the view of FIG. 2, of a portion of a light collector 10. FIG. 4 illustrates the crossmixing of flux paths through the collector for the flux emitted from a series of LED point sources 30. From FIG. 4 it can be seen that the design of light collector 10 supports crossmixing of flux along the long axis of the collector. This comprehensive crossmixing generates a narrow line that appears to be emanating from a single linear light source. In addition, comprehensive crossmixing broadens the range of acceptable LED die irradiance variation.

Figure 5:
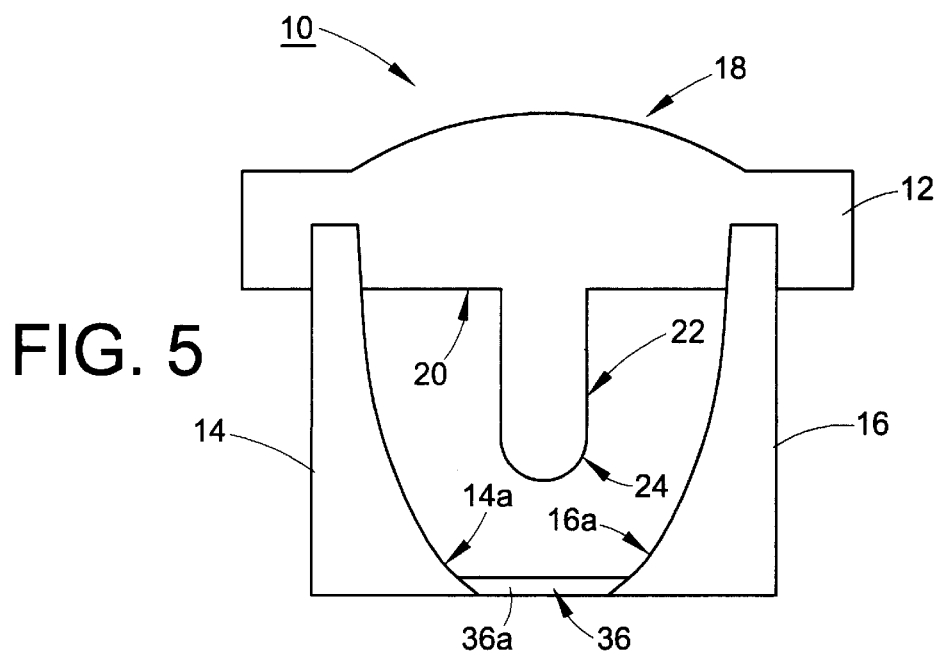
FIG. 5 is an elevational view of a light collector according to a further embodiment of the present invention.
Figure 6:
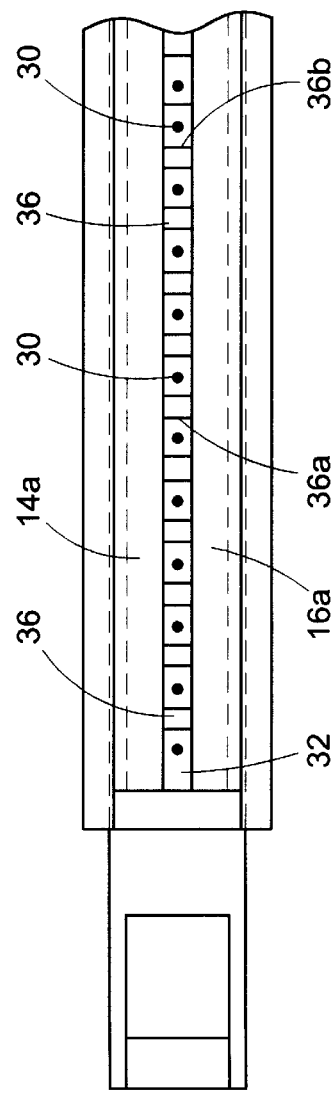
FIG. 6 is a top plan view along a length of the light collector of FIG. 5.
Figure 6:
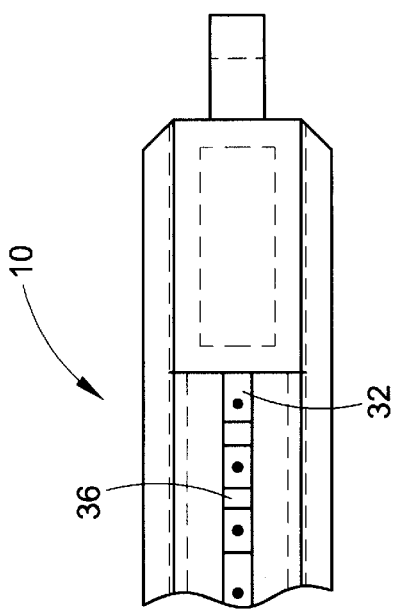
Figure 7:
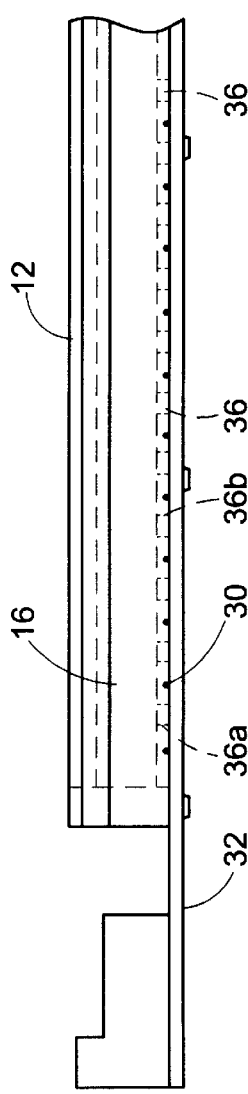
FIG. 7 is a side elevational view along a length of the light collector of FIG. 5.
Figure 7:
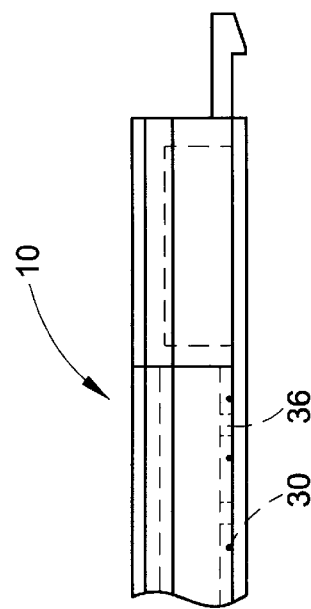

As indicated above, it is intended that the profile of the light collector 10 shown in FIG. 1 be constant throughout the effective length of the collector. Thus, with reference to FIGS. 5–7, the light collector 10 can include a plurality of cross-ribs 36 that are formed integrally with, and extend between, the lower ends of the first and second reflecting members 14 and 16. The cross-ribs 36 fix the position of the first and second reflecting members 14, 16 relative to each other to maintain the light collector profile along the length of the collector without affecting the optical collecting properties of the collector 10. Further, the cross-ribs 36 mechanically stabilize the two reflecting members 14, 16 to facilitate the coating and/or assembly of the light collector 10 to the substrate 32 during manufacture.

The cross-ribs 36 preferably are fabricated with the reflecting members 14, 16 into a unitary structure from an easily molded material, such as ABS. The cross-ribs 36 each include reflective side walls or surfaces 36a and 36b that are coated with a reflective material such as nickel, aluminum, gold, chromium or the like. In a preferred embodiment, reflective surfaces 36a and 36b are planar in shape and are positioned so as to extend perpendicular to the longitudinal axis of the light collector. In the embodiment being described, the cross-ribs 36 are positioned between adjacent light sources 30. Alternatively, the cross-ribs 36 could be spaced farther apart along the longitudinal axis, such as between every Xth light source, where X=2, 3, 4, 5, etc.

With particular reference to FIGS. 8 and 9, by positioning the flat reflective surfaces 36a and 36b to be perpendicular to the longitudinal axis 38, light rays from light sources 30 located adjacent the cross-ribs 36 that strike surfaces 36a and 36b will be specularly, rather than diffusely, reflected. Therefore, virtual images 39 of light sources 30 that lie on the longitudinal axis 38, are formed by the reflected rays. Since the reflecting members 14, 16 and the lens 12 are designed to collect and direct flux from light sources along the axis 38, the rays reflected by the cross-ribs 36 are subsequently properly concentrated onto the photoreceptor 34 in the same manner as rays emanating directly from the LEDs.

It will be understood by those skilled in the art, that for ease of manufacture or for other reasons, it may be desirable to fabricate the above-described cross-ribs 36 with the flat reflective surfaces 36a, 36b rotated at a small angle away from perpendicular to the substrate 32. As long as the deviations from perpendicular is small, for example about 9° or less, the virtual image 39 will lie sufficiently close to the longitudinal axis 38 that the combined action of the lens 12 and reflective surfaces 36a, 36b will be sufficiently preserved as previously described.

As previously discussed, one practical application for the light collector of the present invention is in erase lamps of electrophotographic printers. Referring now to FIG. 10, there is shown a schematic diagram of an electrophotographic printing machine that includes an erase lamp incorporating the light collector of the present invention.

The printer of FIG. 10, employs a belt 40 having a photoconductive surface deposited on a conductive ground layer. The photoconductive belt 40 moves in the direction of arrow 42 to advance successive portions of the photoconductive surface sequentially through the various processing stations disposed about the path of movement thereof. Belt 40 is entrained about stripping roller 44, tensioning roller 46, and drive roller 48. Drive roller 48 is rotated by a motor 50 coupled thereto by suitable means such as a belt drive. As roller 48 rotates, it advances belt 40 in the direction of arrow 42.

Initially, a portion of photoconductive belt 40 passes through a charging station A where corona generating device 52 charges the photoconductive belt to a relatively high, substantially uniform potential. After photoconductive belt 40 is charged, the charged portion thereof is advanced through exposure station B.

At exposure station B, a controller or electronic subsystem (ESS) 54 receives signals representing a desired output image and processes these signals to prepare and control the image data flow to a modulated output generator such as raster output scanner (POS) 56. The image signals transmitted to ESS 54 may originate from a raster input scanner which captures an image from an original document or from a computer to serve as a remotely located printer for one of more computers. The signals from ESS 54 are transmitted to ROS 56 which illuminates specific areas of photoconductive belt 40 to create an electrostatic latent image corresponding to the received image data.

Upon receiving an electrostatic latent image, belt 40 advances to a development station C at which toner, in the form of liquid or dry particles, is placed on the latent image using a commonly known technique such as magnetic brush development, scavangeless development, or the like. Development station C includes toner hopper 60 which dispenses toner particles into developer unit 62. Assuming development station C is of the type generally referred to as a magnetic brush developer, rollers are used to advance charged toner onto the image. Magnetic brush development unit 62 employs a developer material including magnetic carrier granules to which the toner particles adhere through triboelectrification. Development unit 62 is shown as having two developer rollers 64 and 66 that advance developer material into contact with the latent image. The latent image attracts toner particles from the carrier granules forming a toner powder image upon belt 40.

After development, the toner powder image on belt 40 advances toward transfer station D where the toner powder image is transferred from the belt onto a print sheet 68. Prior to reaching transfer station D, belt 40 may be discharged by erase lamp 58 to reduce the holding charge and improve the transfer efficiency. Preferably, erase lamp 58 is of the type described above in FIGS. 1 through 9.

Print sheet 68 is advanced to the transfer station by a conventional sheet feeding apparatus 70. Sheet feeding apparatus 70 may include feed roll 72 contacting the uppermost sheet of stack 74. Feed roll 72 advances the uppermost sheet of stack 74. Feed roll 72 advances the uppermost sheet from the stack 74 to sheet transfer device 76 which may be a chute, conveyor or similar device. Sheet transfer device 76 guides the print sheet into contact with photoconductive belt 40 in a timed relationship such that the sheet is registered to the developed image and contacts the toner powder image at transfer station D. Transfer station D includes corona generating device 78 that sprays ions onto sheet 68 to attract the toner powder image from belt 40 to the sheet. After transfer, print sheet 68 moves in the direction of arrow 80 onto a vacuum conveyor or similar sheet handling device (not shown) which advances the print sheet to fusing station E.

At fusing station E, the transferred powder image is permanently affixed to print sheet 68. Fusing station E employs a fuser roller 82 and a back-up roller 84. Sheet 68 passes between rollers 82 and 84 with the powder image contacting fuser roller 82. Advancing sheet 68 in this manner permanently affixes the powder image to the sheet. After fusing, print sheet 68 advances through chute 86 or similar sheet transfer system output tray 88.

After print sheet 68 is separated from belt 40, residual toner and paper fiber particles adhering to the belt are removed at cleaning station F. Cleaning station F may include a fibrous brush in contact with photoconductive belt 40 to disturb and remove paper fibers and loose toner particles and a cleaning blade to remove adhered toner particles from the belt. Subsequent to cleaning, a discharge lamp 90 floods belt 40 with light to dissipate any residual electrostatic charge remaining on the belt prior to the start of the next successive cycle. Beneficially, discharge lamp 90 embodies an erase lamp of the type described in FIGS. 1 through 9.

Thus, what has been described is a novel light collector for an LED array used as an erase lamp in a xerographic printer. The present invention provides efficient collection and delivery of LED flux to a photoreceptor surface in a well-controlled manner. The light collector of the present invention also provides a design in which the periodic cleaning that is required for all erase lamps, is easily accomplished by wiping the lens with a cloth. Furthermore, when used in erase lamps the present invention promotes a common, reusable design in which a standard configuration includes a linear array of LEDs and reflecting members and the light collector is fabricated in different lengths to meet the requirements of various products.

It will be understood that various changes in the details, materials, steps and arrangement of parts, which have been herein described and illustrated in order to explain the nature of the invention, may be made by those skilled in the art within the principle and scope of the invention as expressed in the appended claims.

What is claimed is:

1. A light collector adapted to be interposed between a light source and a target surface, comprising:
   a cylinder lens having an upper surface and a lower surface, said cylinder lens further having a tongue extending from said lower surface;
   first and second reflecting members, said first and second reflecting members being adapted to support said cylinder lens and to reflect light beams from said light source and direct said reflected light beams to said lower surface; and
   a plurality of cross-ribs extending between said first and second reflecting members to specularly reflect light beams from said light source.

2. The light collector of claim 1 wherein each of said first and second reflecting members comprise a parabolic reflective surface, said parabolic reflective surfaces being positioned relative to each other such that said reflective surfaces combine to form a cylinder mirror.

3. The light collector of claim 2 wherein said reflective surfaces are positioned relative to said light source to locate said light source at the focus of said cylinder mirror.

4. The light collector of claim 2 wherein said cylinder lens is adapted to capture said reflected light beams at said lower surface and direct said captured light beams to a preselected area on said target surface.

5. The light collector of claim 4 wherein:
   said tongue has a distal end adapted to collimate light beams from said light source and direct said collimated light beams through said tongue; and
   said cylinder lens is further adapted to direct said collimated light beams to said preselected area on said target surface.

6. The light collector of claim 1 wherein:
   said tongue has a distal end adapted to capture light beams from said light source; and
   said cylinder lens is adapted to receive said reflected light beams at said lower surface and to direct said captured light beams and said reflected light beams to a preselected area on said target surface.

7. The light collector of claim 6 wherein each of said first and second reflecting members comprise a parabolic reflective surface, said parabolic reflective surfaces combine to form a cylinder mirror having a parabolic cross-section.

8. The light collector of claim 7 wherein said reflective surfaces are positioned relative to said light source to locate said light source at the focus of said cylinder mirror.

9. The light collector of claim 1 wherein each of the plurality of cross-ribs extend transverse to a longitudinal axis of the light collector.

10. The light collector of claim 1 wherein the light source includes a plurality of discrete light sources spaced along a longitudinal axis of the light collector, and each of the plurality of cross-ribs being interposed between adjacent discrete light sources.

11. An apparatus for irradiating a target surface, comprising:

a plurality of light sources arranged in a linear array;

first and second reflecting members being adapted to reflect light beams from said plurality of light sources and direct said reflected light beams toward a single surface;

a cylinder lens having an upper surface, a lower surface and a tongue extending from said lower surface, said cylinder lens being supported by said first and second reflecting members and being adapted to receive said reflected light beams at said lower surface and direct said received light beams to a preselected area on said target surface; and a plurality of cross-ribs extending between said first and second reflecting members to specularly reflect light beams from said plurality of light sources.

12. The apparatus of claim 11 wherein each of said first and second reflecting members comprise a parabolic reflective surface, said parabolic reflective surfaces being positioned to form a parabolic cylinder mirror.

13. The apparatus of claim 12 wherein said reflective surfaces are positioned relative to said plurality of light sources to locate said plurality of light sources at the focus of said parabolic cylinder mirror.

14. The apparatus of claim 12 wherein:

said tongue has a distal end adapted to capture light beams from said plurality of light sources and direct said captured light beams through said tongue; and said cylinder lens is further adapted to direct said captured light beams to said preselected area on said target surface.

15. The apparatus of claim 11 wherein:

said tongue has a distal end adapted to collimate light beams from said plurality of light sources and direct said collimated light beams through said tongue; and said cylinder lens is adapted to direct said collimated light and said reflected light to said preselected area on said target surface.

16. The apparatus of claim 15 wherein each of said first and second reflecting members comprise a parabolic reflective surface, said parabolic reflective surfaces being positioned such that said parabolic reflective surfaces form a parabolic mirror with said plurality of light sources located at the focus of said parabolic mirror.

17. The apparatus of claim 15 wherein light beams emitted from each light source between 90° and approximately 50° relative to a reference surface passing through the light source, are collimated by said distal end of said tongue.

18. The apparatus of claim 15 wherein light beams emitted from each light source between 0° and approximately 50° relative to a reference surface passing through the light source, are reflected and thereby substantially collimated by said first and second reflecting members.

19. The apparatus of claim 11 wherein each of the plurality of cross-ribs extends transverse to a longitudinal axis of the apparatus.

20. The apparatus of claim 11 wherein each of the plurality of cross-ribs are interposed between adjacent light sources.

* * * * *